(12) United States Patent
Rana et al.

(10) Patent No.: US 11,677,000 B2
(45) Date of Patent: Jun. 13, 2023

(54) IC STRUCTURE INCLUDING POROUS SEMICONDUCTOR LAYER UNDER TRENCH ISOLATIONS ADJACENT SOURCE/DRAIN REGIONS

(71) Applicant: GlobalFoundries U.S. Inc., Malta, NY (US)

(72) Inventors: Uzma B. Rana, Slingerlands, NY (US); Steven M. Shank, Jericho, VT (US); Anthony K. Stamper, Burlington, VT (US)

(73) Assignee: GlobalFoundries U.S. Inc., Malta, NY (US)

(*) Notice: Subject to any disclaimer, the term of this patent is extended or adjusted under 35 U.S.C. 154(b) by 0 days.

(21) Appl. No.: 17/450,186

(22) Filed: Oct. 7, 2021

(65) Prior Publication Data
US 2023/0114096 A1    Apr. 13, 2023

(51) Int. Cl.
*H01L 29/06* (2006.01)
*H01L 29/08* (2006.01)
*H01L 21/76* (2006.01)
*H01L 21/8234* (2006.01)
*H01L 27/088* (2006.01)
(Continued)

(52) U.S. Cl.
CPC ...... *H01L 29/0653* (2013.01); *H01L 29/0847* (2013.01); *H01L 29/1083* (2013.01); *H01Q 1/2283* (2013.01)

(58) Field of Classification Search
CPC ............ H01L 21/7627; H01L 21/763; H01L 21/76286; H01L 21/76283; H01L 21/76264; H01L 29/0653; H01L 29/0847; H01L 29/1083
See application file for complete search history.

(56) References Cited

U.S. PATENT DOCUMENTS 6,228,729 B1   5/2001 Ni
6,627,507 B2   9/2003 Yuan
(Continued)

OTHER PUBLICATIONS

Chiappini et al., "Tailored porous silicon microparticles: fabrication and properties," Chemphyschem. 11(5):1029-35, Apr. 6, 2010.
Gharbi et al., "Shallow trench isolation based on selective formation of oxidized porous silicon," Microelectronic Engineering, 88:1214-16, 2011.
(Continued)

*Primary Examiner* — Sonya McCall-Shepard
(74) *Attorney, Agent, or Firm* — Francois Pagette; Hoffman Warnick LLC (57) ABSTRACT

An integrated circuit (IC) structure includes an active device over a bulk semiconductor substrate, and an isolation structure around the active device in the bulk semiconductor substrate. The active device includes a semiconductor layer having a center region, a first end region laterally spaced from the center region by a first trench isolation, a second end region laterally spaced from the center region by a second trench isolation, a gate over the center region, and a source/drain region in each of the first and second end regions. The isolation structure includes: a polycrystalline isolation layer under the active device, a third trench isolation around the active device, and a porous semiconductor layer between the first trench isolation and the polycrystalline isolation layer and between the second trench isolation and the polycrystalline isolation layer.

14 Claims, 6 Drawing Sheets

(51) Int. Cl.
  *H01L 29/10* (2006.01)
  *H01Q 1/22* (2006.01)

(56) References Cited

U.S. PATENT DOCUMENTS

| | | |
|---|---|---|
| 6,683,367 B1 | 1/2004 | Stalmans et al. |
| 7,015,147 B2 | 3/2006 | Lee et al. |
| 7,745,296 B2 | 6/2010 | van Meer et al. |
| 9,299,719 B2 | 3/2016 | Cheng et al. |
| 9,685,456 B2 | 6/2017 | Zhang |
| 9,806,170 B1 | 10/2017 | Mulfinger et al. |
| 10,008,586 B2 | 6/2018 | Leobandung |
| 10,170,475 B2 | 1/2019 | Allegret-Maret et al. |
| 10,755,987 B2 | 8/2020 | Mason et al. |
| 10,790,170 B2 | 9/2020 | Reber et al. |
| 10,796,942 B2 | 10/2020 | Mariani et al. |
| 2004/0217434 A1 | 11/2004 | Lee et al. |
| 2016/0093523 A1 | 3/2016 | Jaffe et al. |
| 2019/0295881 A1* | 9/2019 | Shank .................. H01L 21/763 |

OTHER PUBLICATIONS

Jurczak et al., "Silicon-on-Nothing (SON)—an Innovative Process for Advanced CMOS," IEEE Transactions on Electron Devices, vol. 47, No. 11, 2179-87, Nov. 2000.

Kale and Solanki, "Synthesis of Si Nanoparticles from Freestanding Porous Silicon (PS) Film Using Ultrasonication," 978-1-4244-5892-9/10, IEEE, 2010, 6 pages.

Marsh, "Porous silicon a useful imperfection," Materials Today, vol. 5, Issue 1, pp. 36-41, Jan. 1, 2002.

Nassiopoulou et al., "Porous Si as a substrate material for RF passive integration," 978-1-4673-4802-7/13, IEEE, 2013, 5 pages.

Rack et al., "Small- and Large-Signal Performance up to 175C of Low-Cost Porous Silicon Substrate for RF Applications," IEEE Transactions on Electron Devices, vol. 65, No. 5, pp. 1887-1895, May 2018.

Non Final Office Action dated Apr. 5, 2023 for U.S. Appl. No. 17/449,336, filed Sep. 29, 2021; pp. 16.

* cited by examiner

IC STRUCTURE INCLUDING POROUS SEMICONDUCTOR LAYER UNDER TRENCH ISOLATIONS ADJACENT SOURCE/DRAIN REGIONS

BACKGROUND

The present disclosure relates to integrated circuit (IC) structures, and more specifically, to an IC structure, such as a radio frequency switch, including a porous semiconductor layer under trench isolations adjacent source/drain regions to provide additional isolation for the active device.

In integrated circuit (IC) structures, active devices are electrically isolated by dielectrics such as trench isolations. In radio frequency (RF) device applications such as switches, power amplifiers and other devices, additional isolation layers to reduce harmonics and parasitic losses are advantageous. One current approach uses a trap-rich, high resistivity polycrystalline isolation layer between the buried insulator and the semiconductor substrate in a semiconductor-on-insulator (SOI) substrate. The high resistivity, polycrystalline isolation layer is located below the RF active devices and provides additional isolation to the devices. This approach works well for SOI substrates. However, bulk semiconductor substrates including a high resistivity, polycrystalline isolation layer exhibit higher harmonics and substrate leakage current than SOI substrates.

SUMMARY

An aspect of the disclosure is directed to an integrated circuit (IC) structure, comprising: an active device over a bulk semiconductor substrate, the active device including a semiconductor layer having a center region, a first end region laterally spaced from the center region by a first trench isolation, a second end region laterally spaced from the center region by a second trench isolation, a gate over the center region, and a source/drain region in each of the first and second end regions; and an isolation structure around the active device in the bulk semiconductor substrate, the isolation structure including: a polycrystalline isolation layer under the active device, a third trench isolation around the active device, and a porous semiconductor layer between the first trench isolation and the polycrystalline isolation layer and between the second trench isolation and the polycrystalline isolation layer.

Another aspect of the disclosure includes an integrated circuit (IC) structure, comprising: an active device over a bulk semiconductor substrate, the active device including a semiconductor layer having a center region, a first end region laterally spaced from the center region by a first trench isolation, a second end region laterally spaced from the center region by a second trench isolation, a gate over the center region, and a raised source/drain region over each of the first and second trench isolation; and an isolation structure around the active device in the bulk semiconductor substrate, the isolation structure including: a polycrystalline isolation layer under the active device, a third trench isolation around the active device, and a porous semiconductor layer between the first trench isolation and the polycrystalline isolation layer and the between second trench isolation and the polycrystalline isolation layer.

An aspect of the disclosure related to a method, comprising: forming a semiconductor layer over a bulk semiconductor substrate, the semiconductor layer including a center region, a first end region laterally spaced from the center region by a first opening, and a second end region laterally spaced from the center region by a second opening, wherein a protective cap layer extends over the center region, the first end region and the second end region; forming a porous semiconductor layer in exposed regions of the bulk semiconductor substrate through the first and second openings and adjacent to the first and second end regions; forming an insulator over the semiconductor layer to create first and second trench isolation in the first and second openings and a third trench isolation about the semiconductor layer; forming a polycrystalline isolation layer below the semiconductor layer; and forming an active device with the semiconductor layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure including an active device over a bulk semiconductor substrate, and an isolation structure around the active device in the bulk semiconductor substrate. The active device includes a semiconductor layer having a center region, a first end region laterally spaced from the center region by a first trench isolation, and a second end region laterally spaced from the center region by a second trench isolation. The active device also includes a gate over the center region, and either a source/drain region in each of the first and second end regions or a raised source/drain region over the first and second trench isolations. The isolation structure includes: a polycrystalline isolation layer under the active device, a third trench isolation around the active device, and a porous semiconductor layer between the first trench isolation and the polycrystalline isolation layer and between the second trench isolation and the polycrystalline isolation layer. The IC structure employs a lower cost, low resistivity bulk semiconductor substrate rather than a semiconductor-on-insulator (SOI) substrate, yet it has better performance characteristics for radio frequency (RF) devices than an SOI substrate. For example, the IC structure with the porous semiconductor layer under the trench isolations adjacent the source/drain regions exhibits better current leakage, harmonic distortion, cross-talk resistance, effective resistivity, effective permittivity, and attenuation, compared to current SOI substrate devices.

Figure 1:
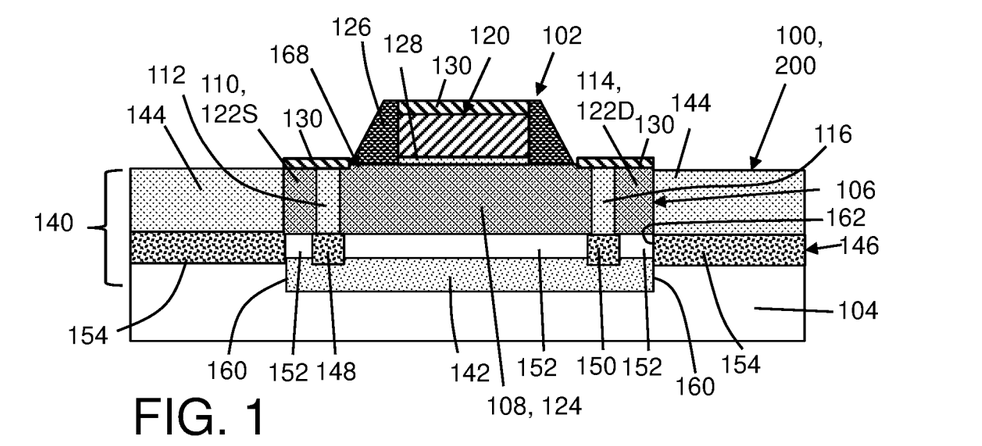
FIG. 1 shows a cross-sectional view of an integrated circuit (IC) structure, according to embodiments of the disclosure.

FIG. 1 shows a cross-sectional view of an IC structure 100, according to embodiments of the disclosure. IC structure 100 includes an active device 102 over a bulk semiconductor substrate 104. Bulk semiconductor substrate 104 includes a low resistivity semiconductor material, which is relatively inexpensive to produce compared to a higher resistivity SOI substrate. Bulk semiconductor substrate 104 may include any semiconductor material that can be made porous, as described herein, including but not limited to silicon. Bulk semiconductor substrate 104 is monocrystalline. A portion of or entirety of bulk semiconductor substrate 104 may be strained.

Figure 10:
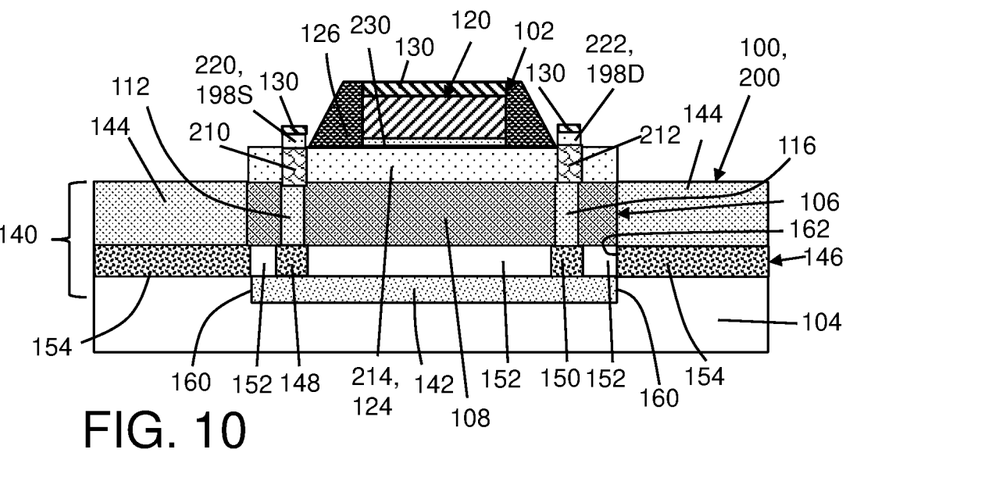
Figure 11:
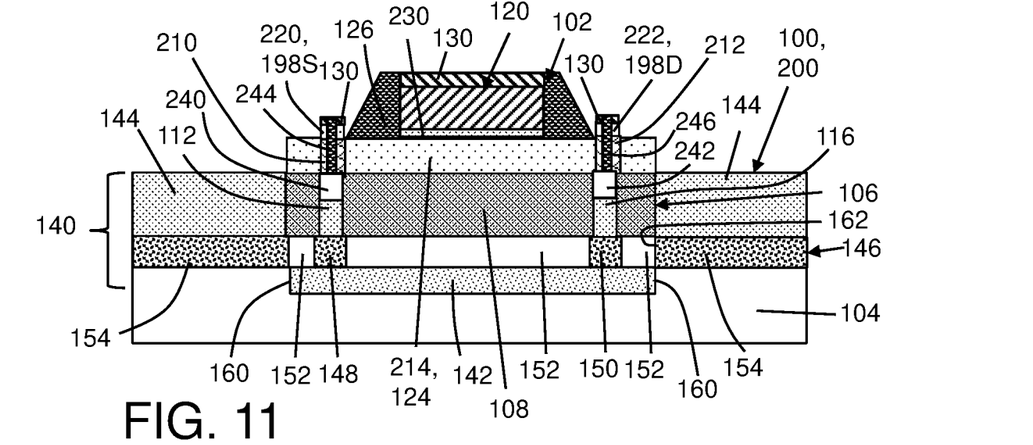
FIGS. 11-12 show cross-sectional views of forming an IC structure, according to another alternative embodiment of the disclosure.

Active device 102 may include any now known or later developed transistor. IC structure 100 may have several applications. For example, as noted herein, it finds advantageous application as a radio frequency (RF) switch 200 (FIGS. 1, 10, 11). Active device 102 may include a semiconductor layer 106 having a center region 108, a first end region 110 laterally spaced from center region 108 by a first trench isolation 112, a second end region 114 laterally spaced from center region 108 by a second trench isolation 116. Active device 102 may also include, for example, a gate 120 over center region 108, and a source/drain region 122S, 122D in each of the first and second end regions 110, 114, respectively. Here, center region 108 provides a channel region 124 for active device 102. Source/drain regions 122S, 122D may include any appropriate dopant within end regions 110, 114. Gate 120 may be a metal or polysilicon gate and may include one or more conductive components for providing a gate terminal of a transistor. For example, metal gates 120 may include a high dielectric constant (high-K) layer, a work function metal layer and a gate conductor (none shown for clarity). A gate cap (not shown) may also be formed over gate 120.

Gate dielectric layer 128 may include any now known or later developed gate dielectric materials such as but not limited to hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. Spacer 126 may include any now known or later developed spacer material such as silicon nitride. A silicide layer 130 for contacts (not shown) may be provided over source/drain 122S in first end region 110 and first trench isolation 112, and over source/drain 122D in second end region 114. Silicide layer 130 may also be provided over gate 120.

In certain embodiments, semiconductor layer 106 may include a semiconductor epitaxial layer in which source/drain regions 122S, 122D are formed. (While source/drain regions are denoted with reference numbers 122S, 122D, the location of the source or drain can be different than inferred by the letter notations). Semiconductor layer 106 has a resistivity higher than bulk semiconductor substrate 104. Hence, center region 108, first end region 110 and second end region 114 have a resistivity higher than bulk semiconductor substrate 104. In one example, bulk semiconductor substrate 104 may have a resistivity of less than approximately 4.0 Ohms per square centimeter ($\Omega/cm^2$), and center region 108, first end region 110 and second end region 114 may have a resistivity of greater than approximately 1000 $\Omega/cm^2$. The terms "epitaxial" and "epitaxially formed and/or grown" means the growth of a semiconductor material on a deposition surface of bulk semiconductor substrate 104 may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

IC structure 100 also includes an isolation structure 140 around active device 102 in bulk semiconductor substrate 104. Isolation structure 140 may include a polycrystalline isolation layer 142 under active device 102. As illustrated, semiconductor layer 106 is over polycrystalline isolation layer 142. As will be described herein, polycrystalline isolation layer 142 may be formed by introducing noble gas ions into bulk semiconductor substrate 104, and annealing. In one example, bulk semiconductor substrate 104 may have a resistivity of less than approximately 4.0 $\Omega/cm^2$, and polycrystalline isolation layer 142 (and semiconductor layer 106) may have a resistivity of greater than approximately 1000 $\Omega/cm^2$. Hence, polycrystalline isolation layer 142 exhibits a high resistance compared to bulk semiconductor substrate 104, and thus acts to electrically isolate an underside of active device 102.

Isolation structure 140 also includes a third trench isolation 144 around active device 102. Trench isolations (TI) 112, 116, 144 include trenches etched into semiconductor layer 106 and/or bulk semiconductor substrate 104, and filled with an insulator. TIs 112, 116, isolation end regions 110, 114 and TI 144 isolate active device 102 at adjacent regions of the substrate. Hence, TIs 112, 116, 144 may be formed simultaneously, as will be described. As will also be described, prior to forming TIs 112, 116, 144, a porous semiconductor layer 146 in parts of bulk semiconductor substrate 104 so it is under first TI 112, second TI 116 and third TI 144. Each TI, 112, 116, 144 may be formed of electrical insulation, and as examples may include: silicon nitride ($Si_3N_4$), silicon oxide ($SiO_2$), fluorinated $SiO_2$ (FSG), hydrogenated silicon oxycarbide (SiCOH), boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TIs 112, 116, 144 may be provided as shallow trench isolations (STI) (shown) or deep trench isolations (DTI). First and second TIs 112, 116 separate end regions 110, 114 from center region 108, i.e., linearly into and out of the page. Third TI 144 surrounds active device 102, and thus also couples with ends of first and second TIs 112, 116 at locations into and out of the page.

Isolation structure 140 also includes a porous semiconductor layer 146 between first trench isolation 112 and polycrystalline isolation layer 142, and between second trench isolation 116 and polycrystalline isolation layer 142. Notably, porous semiconductor layer 146 includes portions 148, 150 between respective trench isolations 112, 116. Portions 148, 150 are separated by portions 152 of bulk semiconductor substrate 104. Optionally, porous semiconductor layer 146 may also include portions 154 between third trench isolation 144 and bulk semiconductor substrate 104. Porous semiconductor layer 146 provides additional resistance to electrically isolate active device 102 from bulk semiconductor substrate 104. Porous semiconductor layer 146 allows IC structure 100 to have electrical isolation that is as good as or better than IC structures built on more expensive, high resistivity SOI substrates. Porous semiconductor layer 146 may include the same material as bulk semiconductor substrate 104, but made porous as described herein. In one example, porous semiconductor layer 146 and bulk semiconductor substrate 104 may include silicon (Si). In one example, porous semiconductor layer 146 has a depth of between 100 nanometers (nm) to 10 micrometers (μm). In some conventional applications, porous silicon has been used as a trench isolation. However, according to embodiments of the disclosure, TIs, 112, 116, 144 and porous semiconductor layer 146 do not include the same material.

Polycrystalline isolation layer 142 does not extend under third TI 144. Polycrystalline isolation layer 142 may include an endwall 160 however contacting at least one of third TI 144 and portions 154 of porous semiconductor layer 146, e.g., depending on a vertical positioning and/or depth of polycrystalline isolation layer 142, third TI 144 and/or portions 154 of porous semiconductor layer 146. Similarly, porous semiconductor layer 146 may include a sidewall 162 in contact with bulk semiconductor substrate 104 (portion 152) and perhaps polycrystalline isolation layer 142.

Isolation structure 140 thus includes polycrystalline isolation layer 142 under active device 102. Isolation structure 140 also includes TIs 112, 116, 144, and includes porous semiconductor layer 146 between first and second TIs 112, 116 and polycrystalline isolation layer 142, and perhaps between third TI 144 and bulk semiconductor substrate 104. TIs 112, 116, 144 do not include the same material as porous semiconductor layer 146, e.g., TIs 112, 116, 144 may include silicon oxide where porous semiconductor layer 146 includes oxidized porous silicon.

Referring to FIGS. 2-8, cross-sectional views of one embodiment of a method of forming IC structure 100 are shown.

Figure 2:
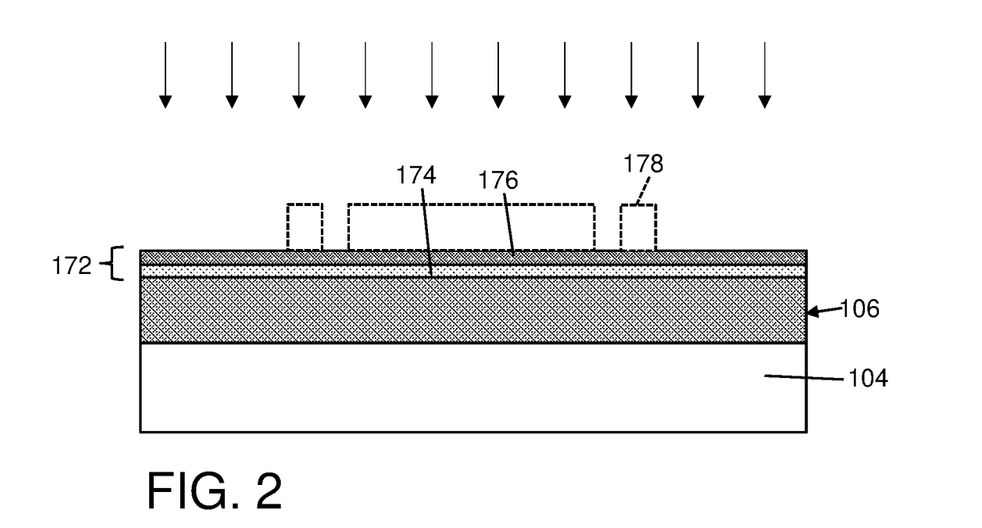
FIGS. 2-8 show cross-sectional views of a method of forming the IC structure, according to embodiments of the disclosure.
Figure 3:
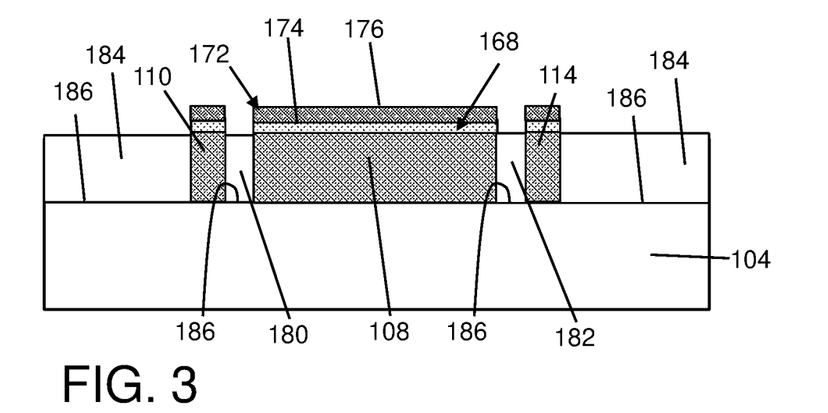

FIGS. 2-3 show forming center region 108, first end region 110 and second end region 114 (FIG. 3), creating an active region 168 (FIG. 8), over bulk semiconductor substrate 104 using a protective cap layer 172. In the example shown in FIG. 2, forming active region 168 includes forming semiconductor layer 106 having a resistivity higher than bulk semiconductor substrate 104. FIG. 2 shows forming semiconductor layer 106 over bulk semiconductor substrate 104. As shown in FIG. 3, semiconductor layer 106 is eventually formed to include center region 108, first end region 110 laterally spaced from center region 108 by first opening 180, and a second end region 114 laterally spaced from center region 108 by second opening 182. A protective cap layer 172 will extend over center region 108, first end region 110 and second end region 114, during some of the processing. Semiconductor layer 146 may be formed through, for example, epitaxial growth in or on bulk semiconductor substrate 104. As noted, bulk semiconductor substrate 104 may have a resistivity of less than approximately 4.0 $\Omega/cm^2$, and semiconductor layer 146 may have a resistivity of greater than approximately 1000 $\Omega/cm^2$.

FIG. 2 also shows formation of protective cap layer 172. In the example shown, protective cap layer 172 includes a number of sub-layers 174, 176 of, for example, oxide in sub-layer 174 and nitride in sub-layer 176; however, other materials are also possible. Protective cap layer 172 may be formed by any appropriate deposition technique(s) for the material formed, e.g., chemical vapor deposition (CVD), atomic layer deposition (ALD), among others. A mask 178 may be used to pattern active region 168 (FIG. 3), e.g., by etching. Mask 178 may include any appropriate mask material for the etching process and material (e.g., silicon) to be etched. Any appropriate etching process may be used, e.g., a RIE or wet etch. As shown in FIG. 3, the etching (arrows in FIG. 2) creates first opening 180 between first end region 110 and center region 108, and second opening 182 between second end region 114 and center region 108. The etching also creates an opening 184 around active region 168. Openings 180, 182, 184 are connected, i.e., at ends of openings 180, 182. Forming openings 180, 182, 184 also creates exposed regions 186 of bulk semiconductor substrate 104. At this stage, mask 178 (FIG. 2) can be removed using any appropriate technique, e.g., an ashing process.

Figure 4:
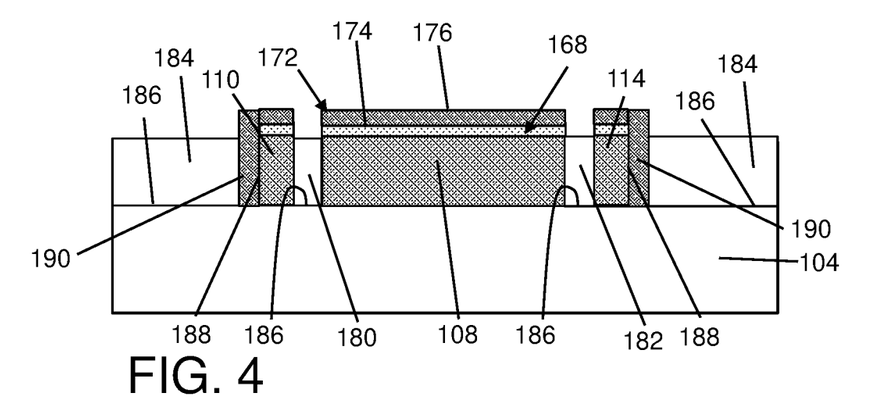

FIG. 4 shows an optional step of (additionally) forming protective cap layer 172 along a sidewall 188 of active region 168. More particularly, portions 190 of protective cap layer 172 extend over a sidewall of first end region 110 and second end region 114. In the example shown, a single nitride layer is used; however, a variety of materials and any number of layers may be used. Portions 190 of protective cap layer 172 provide additional protection of end regions 110, 114 during subsequent formation of porous semiconductor layer 146 (FIG. 6). It is noted, however, that portions 190 of protective layer 172 are not necessary because the processing (FIGS. 5-6) to form porous semiconductor layer 146 may be made selective to bulk semiconductor substrate 104. That is, end portions 110, 114 are immune to the processing.

Figure 5:
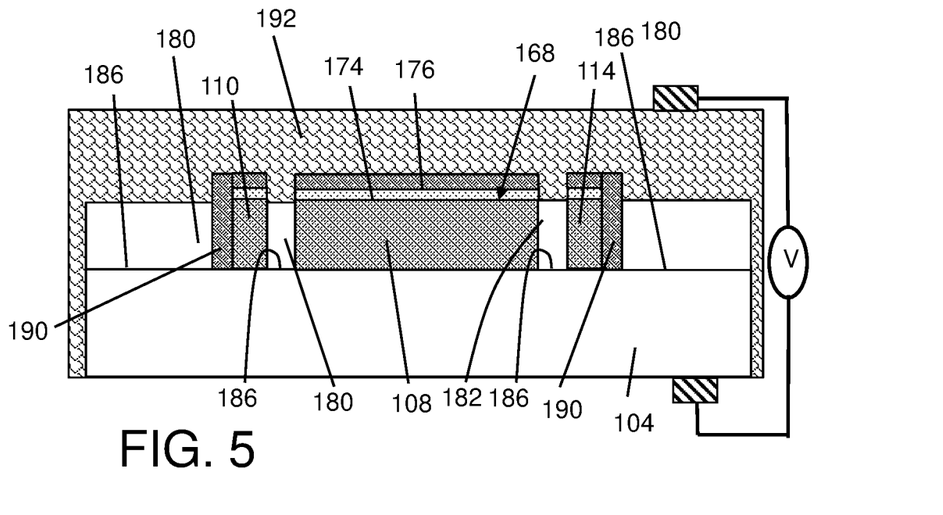
Figure 6:
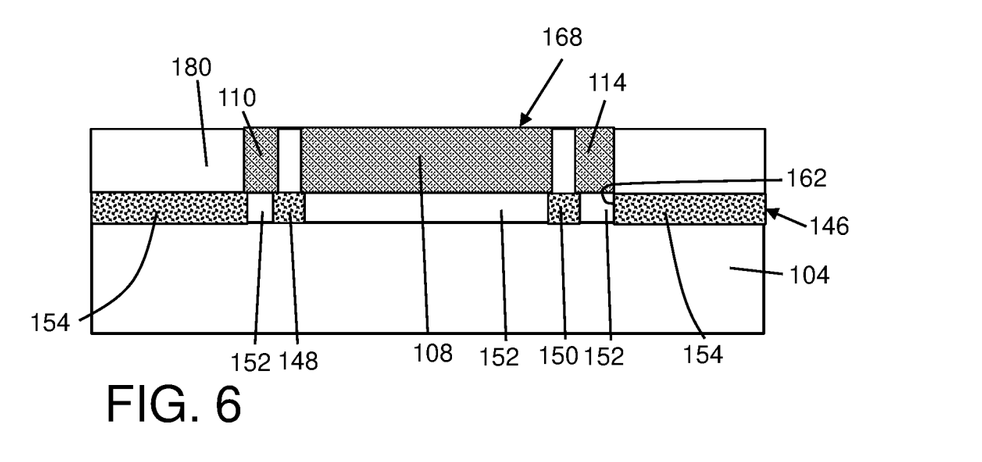

FIGS. 5-6 show forming porous semiconductor layer 146 in exposed regions 186 (FIG. 5) of bulk semiconductor substrate 104 through first and second openings 180, 182 and adjacent to first and second end regions 110, 114. The porous layer forming may include, as shown in FIG. 5, exposing exposed regions 186 to an electrolyte solution 192, and applying a voltage (V) across bulk semiconductor substrate 104. While a variety of techniques are possible, in one example, electrolyte solution 192 may include hydrofluoric (HF) acid that etches the semiconductor material and makes it porous. Other techniques for forming a porous semiconductor layer are known, and thus no additional details are necessary. A depth and width of porous semiconductor layer 146 (FIG. 6) can be controlled by, for example, the duration of exposure to electrolyte solution 192, the electrolyte material and concentration, a width and/or depth of openings 180, 182, and the voltage applied. In one example, porous semiconductor layer 146 (FIG. 6) may have a depth of between 100 nanometers (nm) to 10 micrometers (μm). As illustrated in FIG. 6, portion 148 of porous semiconductor layer 146 is formed in bulk semiconductor substrate 104 via opening 180, and portion 150 of porous semiconductor layer 146 is formed in bulk semiconductor substrate 104 via opening 182. Portions 148, 150 are separated by (remaining) portions 152 of bulk semiconductor substrate 104. Optionally, porous semiconductor layer 146 may also include portions 154 in bulk semiconductor substrate 104. As shown, porous semiconductor layer 146 may include endwall 162 (of portions 154) in contact with bulk semiconductor substrate 104, i.e., portion 152 thereof. Hence, porous semiconductor layer 146 does not constitute an entirety of substrate 104 nor does it extend along an entire length of substrate 104. At this stage, protective cap layer 172 (FIG. 5), including portions 190 (FIG. 5), if provided, can be removed using any appropriate technique, e.g., a selective etch.

Figure 7:
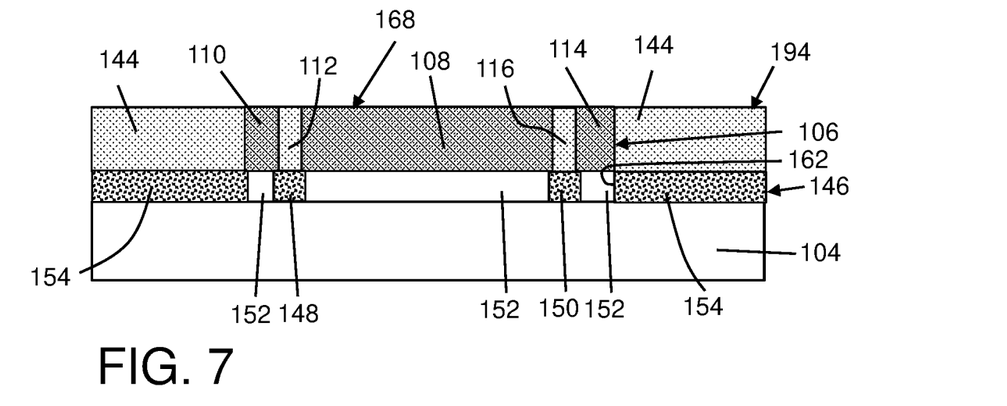

FIG. 7 shows forming an insulator 194 over porous semiconductor layer 146 to create first TI 112 and second TI 116 in first and second openings 180, 182 (FIG. 5), respectively, and third TI 144 around semiconductor layer 106 (i.e., active region 168). In the latter case, insulator 194 surrounds semiconductor layer 106 and hence active region 168 (FIG. 1) to be formed therein. First and second TIs 112, 116 connect to third TI 144 at ends thereof (not shown, into and out of page). Insulator 194 may include any of the materials previously listed herein for TIs 112, 116, 144, e.g., silicon oxide, and may be formed by any appropriate deposition technique, e.g., CVD, ALD, among others. Any necessary planarization step may then occur, e.g., chemical mechanical planarization, to remove any excess insulator 194.

Figure 8:
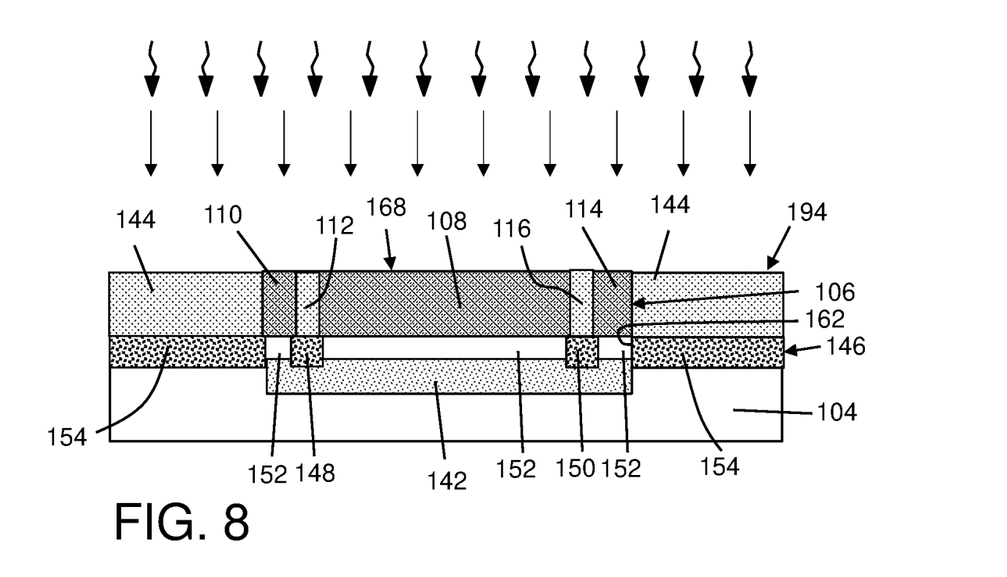

FIG. 8 shows forming polycrystalline isolation layer 142 below semiconductor layer 106, so it is below the eventually formed active region 168 (FIG. 1). Polycrystalline Polycrystalline isolation layer 142 may be formed, for example, by doping an area under active region 168, i.e., under center region 108, first end region 110, second end region 114, and TIs 112, 116. There are a number of ways to dope the desired area to form polycrystalline isolation layer 142. In one example, the process may include implanting a dopant (straight arrows in FIG. 8) into active region 168, and potentially other areas of semiconductor substrate 104, not shown. As illustrated, the dopant is implanted into monocrystalline semiconductor substrate 104. Implanting (or more generally, doping) is the process of introducing impurities (dopants) into a material. An ion implanter is typically employed for the actual implantation. An inert carrier gas such as nitrogen is usually used to bring in the impurity source (dopant). A dosage and an energy level appropriate for the particular bulk semiconductor substrate 104 and desired doping may be specified and/or a resulting doping level may be specified. An example of doping is implanting with argon (Ar) with a dosage of between about 1E12 and 1E13 atoms/cm$^2$, and an energy of about 40 to 500 keV to produce a doping level of between 1E17 and 1E18 atoms/cm$^3$. In this case, as shown in FIG. 8, the doping is carried out to damage the monocrystalline material to which it is applied.

FIG. 8 also shows one or more thermal cycle(s), e.g., an anneal indicated by curved arrows, that re-orders the damaged and disordered crystallographic material into polycrystalline material. The thermal cycle(s) may include one or more intentionally added recrystallization anneal(s) shortly after implant, or the normal high temperature (>600° C.) process(es) associated with semiconductor manufacturing. In this manner, the process converts monocrystalline bulk semiconductor substrate 104 (under active region 168) to polycrystalline isolation region 142. The dopant implanted may be include any material capable of creating polycrystalline material including but not limited to: germanium (Ge); a noble gas such as argon (Ar) or xenon (Xe); or a combination of the previously listed materials such as Ge—Ar or Ge—Xe. The vertical location at which polycrystalline isolation layer 142 starts and the depth of layer 142 can be controlled by the duration and energy of the ion implanting used. As noted, endwall 162 of porous semiconductor layer 146 may be in contact with polycrystalline isolation layer 142 and bulk semiconductor substrate 104. Polycrystalline isolation layer 142 does not extend under third TI 144. In an alternative embodiment, polycrystalline isolation layer 142 may be formed in bulk semiconductor substrate 104 prior to any of the processing shown in FIGS. 2-8, and active region 169 and TIs 112, 116, 144 may be formed thereover. In any event, polycrystalline isolation layer 142 may have a resistivity of, for example, greater than 1000 Ω/cm$^2$, providing relatively strong resistance to current leakage from under active device 102 (FIG. 1).

Returning to FIG. 1, forming an active device 102 with semiconductor layer 106 is illustrated. Active device 102 may be formed using any now known or later developed semiconductor fabrication techniques, the options of which are well known and will not be described in detail. In any event, forming active device 102 may include forming gate 120 over center region 108, first source/drain region 122S in first end region 110 and second source/drain region 122D in second end region 114. Gate(s) 120 may be formed using any now known or later developed processes. In one non-limiting example, gate(s) 120 material may be deposited and patterned using photolithography, and spacer 126 formed thereabout, e.g., by depositing a nitride and etching back. A nitride cap (not shown) may be formed over gate(s) 120. Gate(s) 120 may include dummy gate material, e.g., including sacrificial material to be replaced with the final gate material after source/drain region 122S, 122D formation, or they may include the final gate material, e.g., polysilicon or metal gate material. Source/drain regions 122S, 122D may be formed using any appropriate process, e.g., masked doping and annealing.

FIG. 1 also shows processing after forming silicide layer 130 over each of pair of source/drain regions 122S, 122D. Silicide layer 130 may include any silicide for coupling to contacts (not shown) through an interlayer dielectric (ILD) (not shown). Silicide layer 130 may be formed using any now known or later developed technique, e.g., performing an in-situ pre-clean, depositing a metal such as titanium, nickel, cobalt, platinum, etc., annealing to have the metal react with silicon of end regions 110, 114, and removing unreacted metal. Normally, silicide layer 130 would not form on first and second TIs 112, 116. However, TIs 112, 116 are sufficiently small that silicide layer 130 spans over the TIs, and hence is shown as a contiguous layer. An ILD (not shown) may be deposited and include any now known or later developed ILD material. Any desired interconnects, e.g., contacts and wiring (not shown), may be formed through the ILD in a known fashion.

Figure 9:
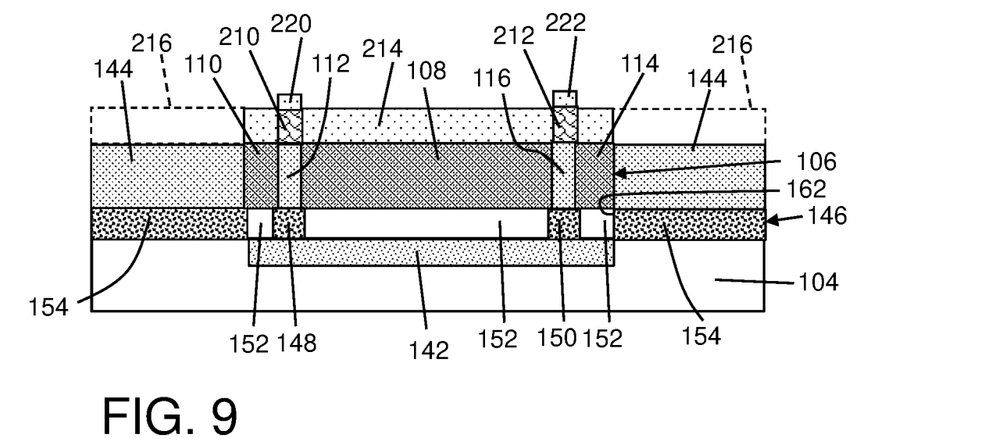
FIGS. 9 and 10 show cross-sectional views of forming an IC structure, according to an alternative embodiment of the disclosure.

FIGS. 9 and 10 show cross-sectional views of forming IC structure 100, according to an alternative embodiment of the disclosure. More particularly, FIGS. 9 and 10 show forming a first raised source/drain (RSD) region 198S over first TI 112, and forming a second raised source/drain (RSD) region 198D over second TI 116. (While the raised source/drain regions are denoted with reference numbers 198S, 198D, the location of the source or drain can be different than inferred by the letter notations.) FIG. 9 follows the processes of FIG. 8. RSD regions 198S, 198D may be formed in any now known or later developed fashion. In the example shown in FIG. 9, a number of processes have occurred. FIG. 9 shows forming a first polysilicon section 210 on first TI 112, a second polysilicon section 212 on second TI 116, and a silicon layer 214 over semiconductor layer 106 between first polysilicon section 210 and second polysilicon section 212. This process may include epitaxially growing first polysilicon section 210 over first TI 112, second polysilicon section 212 over second TI 116, and silicon layer 214 over semiconductor layer 116. Where the growth occurs on TIs 112, 116, 144, polysilicon is formed, and where growth occurs on semiconductor layer 106, silicon is formed. Polysilicon section(s) 216 (dashed lines) that would form on third TI 144 are removed, e.g., by forming any necessary mask and etching to remove the polysilicon from over third TI 144. Polysilicon sections 210, 212 have a width to match, as close as possible, that of RSD regions 198S, 198D (FIG. 10) to be formed thereover. In one non-limiting example, the width may range between 300-600 nanometers (nm). Polysilicon sections 210, 212 may have a thickness of, for example, 10-60 nm.

FIG. 9 also shows forming a first silicon section 220 over first polysilicon section 210 and a second silicon section 222 over second polysilicon section 212. Silicon sections 220, 222 may be formed as a continuance of the epitaxial growth from semiconductor layer 106 and polysilicon sections 210, 212. Silicon sections 220, 222 may have any thickness desired for RSD regions 198S, 198D (FIG. 10). In one embodiment, a thickness of silicon sections 220, 222 over polysilicon sections 210, 212 is made to approach that of SOI layers in SOI substrates to obtain similar performance as SOI substrates even though transistor 100 is formed on bulk semiconductor substrate 104. In one non-limiting example, silicon sections 220, 222 may have a thickness in the range 10-60 nm.

FIG. 10 shows a cross-sectional view of forming active device 102 by forming gate 120 over a region of silicon layer 214 between first silicon section 220 and second silicon section 222. As illustrated, upper surfaces (below silicide layer 130) of first and second silicon sections 220, 222 are higher than a lower surface 230 of gate 120. Silicon layer 214 provides channel region 124 between eventually formed first RSD region 198S and second RSD region 198D. FIG. 10 also shows forming active device 102 includes forming an RSD region 198S, 198D over each of first and second TIs 112, 116. More particularly, forming active device 102 includes forming first RSD region 198S in first silicon section 220 over first TI 112, and forming second RSD region 198D in second silicon section 222 over second TI 116. Gate(s) 120 and RSD regions 198, 198D may be formed using any now known or later developed processes, as previously described herein. For example, RSD regions 198S, 198D may be formed by doping silicon sections 220, 222 with appropriate dopants (e.g., using ion implanting), and annealing to drive in the dopants. The dopants used may vary depending on the type of transistor to be formed. Silicide layer 130 may be formed, as previously described herein. In FIG. 10, silicide layer 130 is over first RSD region 198S over first TI 112, and over second RSD region 198D over second TI 116.

Figure 12:
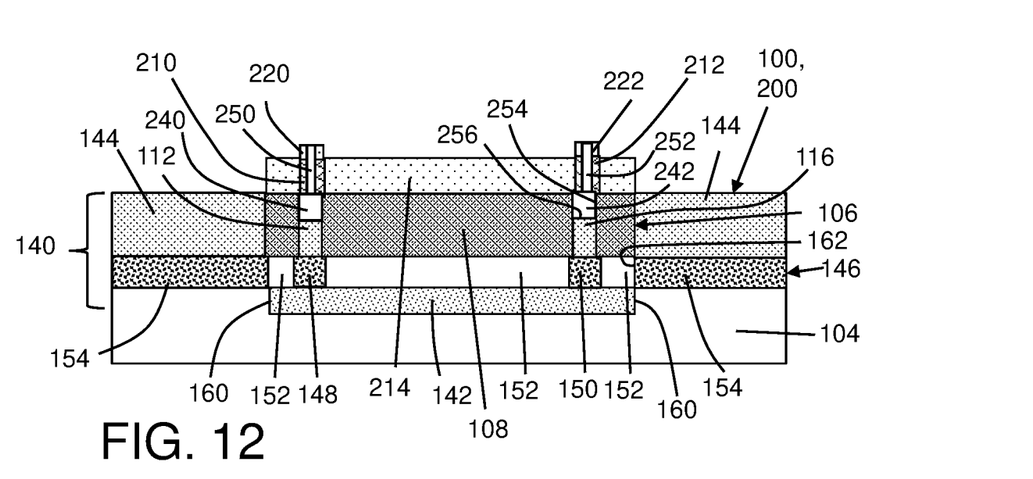

FIGS. 11 and 12 show cross-sectional views of forming IC structure 100, according to another alternative embodiment of the disclosure. IC structure 100 in FIG. 11 includes, in addition to the structure shown in FIG. 10, a first air gap 240 in first TI 112 (i.e., under RSD 198S) and a second air gap 142 in second TI 116 (i.e., under RSD 198D). IC structure 100 also includes a nitride plug 244, 246 extending through each of RSD regions 198S, 198D, i.e., to plug the air gaps.

In terms of process, FIG. 12 show a cross-sectional view of forming first air gap 240 (FIG. 11) in first TI 112 (i.e., under RSD 198S), and second air gap 242 (FIG. 11) in second TI 116 (i.e., second RSD region 198D). FIG. 12 proceeds after the processing shown in FIG. 9. Air gaps 240, 242 forming under first and second RSD regions 198S, 198D may include forming a first vent hole 250 through first silicon section 220 and first polysilicon section 210, and a second vent hole 252 through second silicon section 222 and second polysilicon section 212 (or through RSD regions 198S, 198D if already formed in silicon sections 220, 222). Vent holes 250, 252 may be formed using any now known or later developed process, e.g., forming a patterned mask having small openings matching the location of vent holes 250, 252, and etching (e.g., a RIE). FIG. 12 also shows removing a first portion of first TI 112 under first polysilicon section 210 through first vent hole 250, and removing a second portion of second TI 116 under second polysilicon section 212 through second vent hole 252. The removing may include etching portions of TIs 112, 116 using, for example, hot ammonia ($NH_3$) and/or hydrochloric acid, through vent holes 250, 252, as known in the art. Semiconductor layer 106 may define inner sidewall surface 254 (shown for right air gap 242 only for clarity) of each of air gap 240, 242, and TIs 112, 116 may define lower surface 256 of each air gap 240, 242. As shown in FIG. 11, sides of first air gap 240 and second air gap 242 are aligned to edges of gate 120 (i.e., spacer 126 thereof) and channel region 124 in silicon layer 214. After the portions of TIs 112, 116 are removed, an optional thermal oxidation to passivate the air gap semiconductor surfaces may be performed. The removal of the portions of TIs 112, 116 leaves gas in the spaces, e.g., air.

Returning to FIG. 11, sealing first and second vent holes 250, 252 (FIG. 12) to form/complete first air gap 240 and second air gap 242 may include filling the vent holes, creating filled vent holes or plugs 244, 246. Sealing may be carried out, for example, by depositing a dielectric such as nitride and/or a spacer nitride. The sealing may occur simultaneously with formation of spacer 126 of gate 120. As shown, forming first and second air gaps 240, 242 may include forming a nitride plug 244, 246 extending through first and second RSD regions 198S, 198D. It is noted that vent holes 250, 252 (FIG. 12) have a sufficiently small lateral size (across or into page in FIG. 12) compared to eventually formed RSD regions 198S, 198D (FIG. 11), so that sealing them does not adversely impact the electrical properties of RSD regions 198S, 198D (FIG. 11). Forming active device 102, including forming gate 120, first RSD region 198S and second RSD region 198D, may be occur thereafter as described relative to FIG. 10. Silicide layer 130 may be formed, as previously described herein. In FIG. 11, however, nitride plugs 244, 246 extend through silicide layer 130. That is, silicide layer 130 does not form on nitride plugs 244, 246, it only forms on first RSD region 198S and second RSD region 198D.

Embodiments of the disclosure provide IC structure 100 that uses a lower cost, low resistivity bulk semiconductor substrate 104 rather than a more expensive, higher resistivity SOI substrate. Despite the lower cost substrate, IC structure 100 with isolation structure 140 has better performance characteristics than a device in an SOI substrate, e.g., for radio frequency (RF) switches. For example, IC structure 100 exhibits better current leakage, harmonic distortion, cross-talk resistance, effective resistivity, effective permittivity, and attenuation, compared to current SOI substrate devices. One example SOI n-type field effect (NFET) RF switch that includes a high resistivity polycrystalline isolation layer exhibits an 'under trench isolation' resistance of about 1E6Ω, and a leakage current of approximate 10 micro-Amperes (μA). In contrast, a similar NFET RF switch 200 employing IC structure 100 according to embodiments of the disclosure may exhibit an under trench isolation of about 300-400 nanometers (nm), and a leakage current of less than approximately 1.0 μA. RSD regions 198S, 198D with or without air gaps 240, 242 thereunder may also be employed to further improve performance. The reduction in $C_{DS}$ by air gaps 240, 242 under RSD regions 198S, 198D may be up to approximately 50%, which can reduce off capacitance ($C_{off}$) by up to 25% to approach or match that value in SOI substrates. While air gaps 240, 242 provide this advantage, they are not located under channel region 124 under gate 120, thus eliminating any mechanical stresses caused by that arrangement. Other operational parameters exhibit similar improvements.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    an active device over a bulk semiconductor substrate, the active device including a semiconductor layer having a center region, a first end region laterally spaced from the center region by a first trench isolation, a second end region laterally spaced from the center region by a second trench isolation, a gate over the center region, and a source/drain region in each of the first and second end regions; and
    an isolation structure around the active device in the bulk semiconductor substrate, the isolation structure including:
        a polycrystalline isolation layer under the active device,
        a third trench isolation around the active device, and
        a porous semiconductor layer between the first trench isolation and the polycrystalline isolation layer and between the second trench isolation and the polycrystalline isolation layer.

2. The IC structure of claim 1, wherein the center region, the first end region and the second end region have a resistivity higher than the bulk semiconductor substrate.

3. The IC structure of claim 2, wherein the bulk semiconductor substrate has a resistivity of less than 4 Ohms per square centimeter ($\Omega/cm^2$), and the center region, the first end region and the second end region and the polycrystalline isolation layer have a resistivity of greater than 1000 $\Omega/cm^2$.

4. The IC structure of claim 2, further comprising a silicide layer over the source/drain region in the first end region and the first trench isolation, and over the source/drain region in the second end region and the second trench isolation.

5. The IC structure of claim 1, wherein the active device includes a radio frequency (RF) switch.

6. The IC structure of claim 1, wherein the porous semiconductor layer also includes portions between the third trench isolation and the bulk semiconductor substrate, and the polycrystalline isolation layer includes an endwall contacting the portions of the porous semiconductor layer.

7. The IC structure of claim 6, wherein the portions of the porous semiconductor layer each include a sidewall in contact with the polycrystalline isolation layer and the bulk semiconductor substrate.

8. An integrated circuit (IC) structure, comprising:
   an active device over a bulk semiconductor substrate, the active device including a semiconductor layer having a center region, a first end region laterally spaced from the center region by a first trench isolation, a second end region laterally spaced from the center region by a second trench isolation, a gate over the center region, and a raised source/drain region over each of the first and second trench isolation; and
   an isolation structure around the active device in the bulk semiconductor substrate, the isolation structure including:
      a polycrystalline isolation layer under the active device,
      a third trench isolation around the active device, and
      a porous semiconductor layer between the first trench isolation and the polycrystalline isolation layer and between the second trench isolation and the polycrystalline isolation layer.

9. The IC structure of claim 8, wherein the center region, the first end region and the second end region have a resistivity higher than the bulk semiconductor substrate.

10. The IC structure of claim 9, wherein the bulk semiconductor substrate has a resistivity of less than 4 Ohms per square centimeter ($\Omega/cm^2$), and the center region, the first end region and the second end region and the polycrystalline isolation layer have a resistivity of greater than 1000 $\Omega/cm^2$.

11. The IC structure of claim 8, further comprising a silicide layer over the raised source/drain region over the first trench isolation, and over the raised source/drain region over the second trench isolation.

12. The IC structure of claim 8, wherein the porous semiconductor layer also includes portions between the third trench isolation and the bulk semiconductor substrate, and the polycrystalline isolation layer includes an endwall contacting the portions of the porous semiconductor layer.

13. The IC structure of claim 8, further comprising an air gap in the first trench isolation and the second trench isolation, and a nitride plug extending through each of the raised source/drain regions.

14. The IC structure of claim 8, wherein the active device includes a radio frequency (RF) switch.

* * * * *